US009397151B1

(12) United States Patent
Astrof et al.

(10) Patent No.: US 9,397,151 B1
(45) Date of Patent: Jul. 19, 2016

(54) PACKAGED INTEGRATED CIRCUITS HAVING HIGH-Q INDUCTORS THEREIN AND METHODS OF FORMING SAME

(71) Applicant: Integrated Device Technology, Inc., San Jose, CA (US)

(72) Inventors: Kenneth L. Astrof, Edmonds, WA (US); Robert A. Gubser, Arlington, WA (US); Ajay Kumar Ghai, San Jose, CA (US); Viresh Piyush Patel, Austin, TX (US); Jitesh Shah, Fremont, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 153 days.

(21) Appl. No.: 14/136,040

(22) Filed: Dec. 20, 2013

(51) Int. Cl.
*H01L 49/02* (2006.01)

(52) U.S. Cl.
CPC ...................... *H01L 28/10* (2013.01)

(58) Field of Classification Search
CPC ....................................... H01L 28/10
USPC ............................................. 257/531
See application file for complete search history.

(56) References Cited

U.S. PATENT DOCUMENTS

| | | | |
|---|---|---|---|
| 5,577,319 A | 11/1996 | Knecht | |
| 5,702,775 A | 12/1997 | Anderson et al. | |
| 5,815,054 A | 9/1998 | Vojak et al. | |
| 5,928,598 A | 7/1999 | Anderson et al. | |
| 6,114,937 A * | 9/2000 | Burghartz et al. | 336/200 |
| 6,635,949 B2 * | 10/2003 | Lowther et al. | 257/531 |
| 6,759,727 B2 * | 7/2004 | Ju | 257/531 |
| 6,786,654 B2 * | 9/2004 | Kilian | G02B 6/4202 |
| | | | 385/94 |
| 6,798,039 B1 | 9/2004 | Gillespie et al. | |
| 6,998,925 B2 * | 2/2006 | Harima et al. | 331/68 |
| 7,291,513 B2 | 11/2007 | Ouellet et al. | |
| 7,605,521 B2 | 10/2009 | Kuwahara | |
| 7,875,955 B1 * | 1/2011 | Hopper | H01F 17/0006 |
| | | | 257/516 |
| 7,955,885 B1 | 6/2011 | Bhugra et al. | |
| 8,035,454 B2 | 10/2011 | Navet | |
| 8,044,755 B2 * | 10/2011 | Smeys | H01F 17/0006 |
| | | | 257/531 |

(Continued)

OTHER PUBLICATIONS

Ruffieux et al. "A Versatile Timing Microsystem Based on Wafer-Level Packaged XTAL/BAW Resonators with Sub-μW RTC Mode and Programmable HF Clocks", 2013 *IEEE International Solid-State Circuits Conference, ISSCC 2013*, Feb. 19, 2013, 196-198.

(Continued)

*Primary Examiner* — Allen Parker
*Assistant Examiner* — Stephen Bradley
(74) *Attorney, Agent, or Firm* — Myers, Bigel & Sibley P.A.

(57) ABSTRACT

A packaged integrated circuit includes an integrated circuit substrate and a cap bonded to a surface of the integrated circuit substrate. The cap has a recess therein that is at least partially lined with at least one segment of an inductor. This inductor may be electrically coupled to an electrical component within the integrated circuit substrate. In some embodiments, the inductor is patterned to extend along a sidewall and interior top surface of the recess, which extends opposite the integrated circuit substrate. The inductor may include a plurality of arcuate-shaped segments and may be patterned to be symmetric about a center-tapped portion thereof. The cap may also include a magnetic material therein that increases an effective inductance of the inductor relative to an otherwise equivalent cap and inductor combination that is devoid of the magnetic material.

15 Claims, 15 Drawing Sheets

(56) References Cited

U.S. PATENT DOCUMENTS

| | | | |
|---|---|---|---|
| 8,164,159 B1 | 4/2012 | Armstrong et al. | |
| 8,294,260 B2 | 10/2012 | Ito et al. | |
| 8,466,537 B1* | 6/2013 | Papou | H01L 23/5227 |
| | | | 257/531 |
| 8,476,810 B2 | 7/2013 | Hashi | |
| 8,482,358 B2 | 7/2013 | Yamada | |
| 2005/0258507 A1* | 11/2005 | Tseng et al. | 257/531 |
| 2006/0016065 A1 | 1/2006 | Nagaura | |
| 2007/0085648 A1* | 4/2007 | Lee | H01F 17/0033 |
| | | | 336/200 |
| 2008/0042260 A1* | 2/2008 | Jeong | B81B 7/007 |
| | | | 257/704 |
| 2008/0231145 A1 | 9/2008 | Nagano et al. | |
| 2009/0015363 A1* | 1/2009 | Gardner | 336/200 |
| 2012/0025673 A1 | 2/2012 | Nagano et al. | |
| 2012/0056510 A9 | 3/2012 | Chen et al. | |
| 2013/0335157 A1* | 12/2013 | Ishii | H01L 41/0475 |
| | | | 331/158 |

OTHER PUBLICATIONS

Zoschke et al. "Hermetic Wafer Level Packaging of MEMS Components Using Through Silicon Via and Wafer to Wafer Bonding Technologies", *The 63rd Electronic Components and Technology Conference, ECTC 2013*, May 28-31, 2013, Las Vegas, NV, USA, 33 pages.

Zoschke et al. "Hermatic Wafer Level Packaging of MEMS Components Using Through Silicon Via and Wafer to Wafer Bonding Technologies", *IEEE 2013 Electronic Components & Technology Conference*, 2013, 1500-1507.

* cited by examiner

PACKAGED INTEGRATED CIRCUITS HAVING HIGH-Q INDUCTORS THEREIN AND METHODS OF FORMING SAME

CROSS-REFERENCE TO RELATED APPLICATION

This application is related to U.S. application Ser. No. 14/015,471, filed Aug. 30, 2013, the disclosure of which is hereby incorporated herein by reference.

BACKGROUND OF THE INVENTION

Current state-of-the art microelectromechanical (MEMs) resonators have recently challenged the quartz-dominated timing industry, notwithstanding the perceived temperature instabilities of such MEMs devices, which has led to the development of very high performance temperature sensors in MEMs-based circuits to thereby support levels of frequency stability that are typically associated with crystal oscillators (XO). Moreover, because one of the significant advantages of MEMs-based technology is the highly integrated semiconductor manufacturing technologies that support high volume wafer-level encapsulation of MEMs components, efforts have been made to determine how crystal-based resonators can benefit from similar wafer-level scale and vacuum sealing packaging technologies. One example of a wafer-scale packaging technology is disclosed in U.S. Pat. No. 7,955,885 to Bhugra et al., entitled "Methods of Forming Packaged Micro-Electromechanical Devices," the disclosure of which is hereby incorporated herein by reference.

An example of a conventional real time clock (RTC) module includes a hybrid combination of an application specific integrated circuit (ASIC) and a crystal blank inside a ceramic package. However, as disclosed in an article by Ruffieux et al., entitled "A Versatile Timing Microsystem Based on Wafer-Level Packaged XTAL/BAW Resonators with Sub-uW RTC Mode and Programmable HF Clocks," 2013 IEEE International Solid-State Circuits Conference, Feb. 19, 2013, pp. 196-198, a ceramic package may be replaced with silicon and the circuit may be implemented as an active part of the package. U.S. Pat. No. 8,035,454 to Navet discloses a crystal oscillator device containing a piezoelectric resonator element and integrated circuit (IC) chip within a vacuum chamber.

Quartz, MEMs and LC-based timing applications typically utilize inductors to support resonance frequencies and/or timing circuit operation (e.g., VCO operation). However, achieving high-quality (i.e., high-Q) inductors can often be difficult using conventional wafer-scale fabrication techniques. As will be understood by those skilled in the art, high-Q inductors require low series resistance, smooth metal surfaces and small grain structure. Typical inductor materials include copper and silver, but not aluminum. Moreover, because inductors create surrounding fields, forming inductors adjacent lossy materials will significantly reduce their Q. Accordingly, high value inductors, such as spiral inductors, may provided insufficiently high Q when formed on an integrated circuit (IC) substrate having relatively low resistivity. One example of a spiral inductor is disclosed in commonly assigned U.S. Pat. No. 6,798,039 to Gillespie et al., entitled "Integrated Circuit Inductors Having High Quality Factors," the disclosure of which is hereby incorporated herein by reference. Another example of an inductor that utilizes encapsulating shielding layers to inhibit a loss in Q is disclosed in commonly assigned U.S. Pat. No. 8,164,159 to Armstrong et al., entitled "Semiconductor Resonators with Electromagnetic and Environmental Shielding and Methods of Forming Same," the disclosure of which is hereby incorporated herein by reference.

SUMMARY OF THE INVENTION

A packaged integrated circuit according to some embodiments of the invention includes an integrated circuit substrate and an electrically insulating cap that is bonded to a first surface of the integrated circuit substrate to provide a seal therebetween (e.g., hermetic seal). In these embodiments, the cap includes at least one recess therein that is at least partially lined with at least one segment of an inductor. This inductor may be electrically coupled to an electrical component within the integrated circuit substrate. The inductor may also be patterned to extend along a sidewall and interior top surface of the recess, which extends opposite the integrated circuit substrate.

According to additional embodiments of the invention, the inductor can be a center-tapped inductor and can include a plurality of arcuate-shaped segments, which are patterned to extend on the interior top surface of the recess and be symmetric about the center tap. The inductor may also have at least one terminal located external to the recess. This terminal may be electrically connected to an active circuit within the underlying integrated circuit substrate.

According to still further embodiments of the invention, the cap may be configured to include a magnetic material therein, which increases an effective inductance of the inductor relative to an otherwise equivalent cap and inductor combination that is devoid of the magnetic material. In this manner, the inductor may be utilized to store energy for applications including, among other things, switched-mode power supplies using a single sealed package.

A packaged integrated circuit according to additional embodiments of the invention includes an integrated circuit substrate and a cap bonded to a first surface of the integrated circuit substrate. The cap includes at least a first through-cap via (TCV) therein, which can be filled with a first segment of an inductor. The cap may also include a second through-cap via (TCV) therein, which is filled with a second segment of the inductor and these first and second inductor segments may be electrically connected together by another inductor segment. In particular, a third inductor segment may extend on an outside surface of the cap and a fourth inductor segment may extend on an inside surface of the cap and one or both of these segments may be electrically connected to the first and/or second inductor segments within the TCVs.

DETAILED DESCRIPTION OF EMBODIMENTS

Figure 1A:
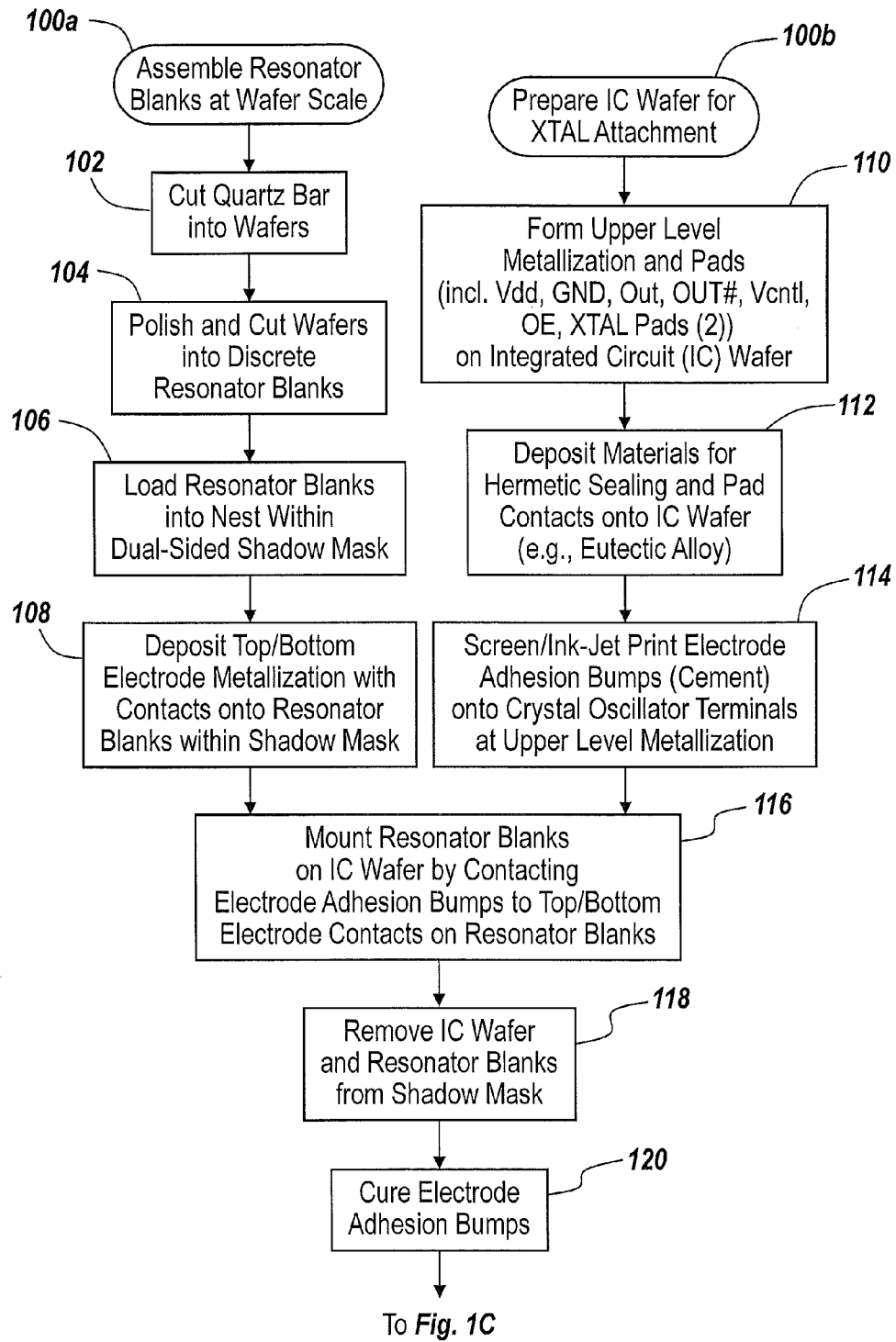
FIGS. 1A-1C are flow diagrams that illustrate methods of forming crystal-based oscillator circuits using wafer-scale fabrication techniques, according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
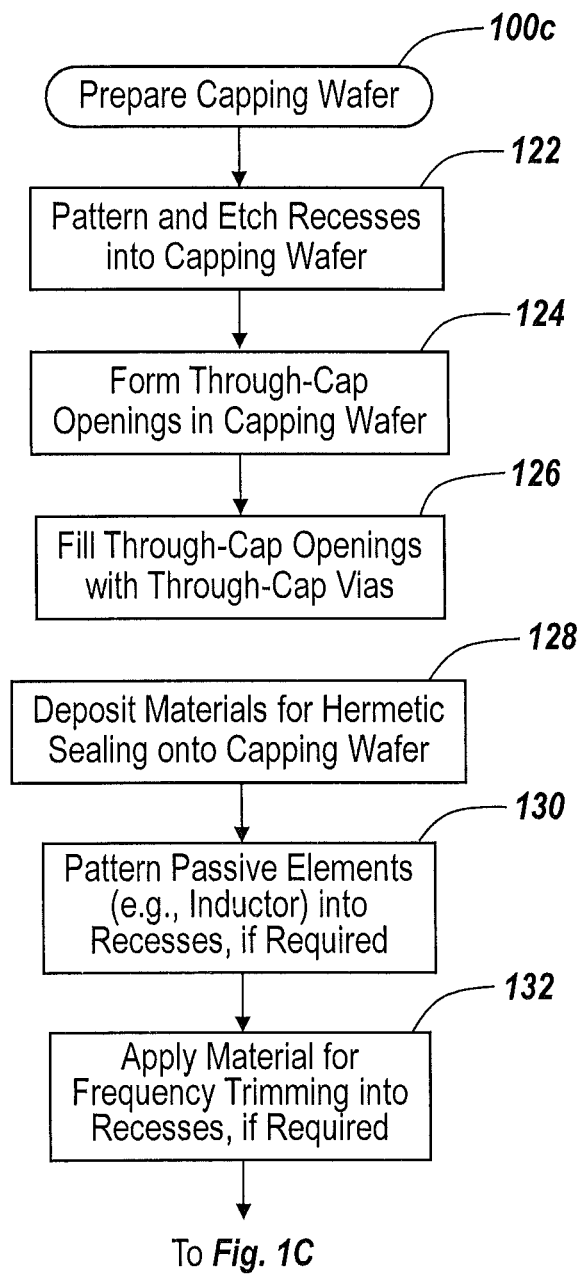
Figure 1C:
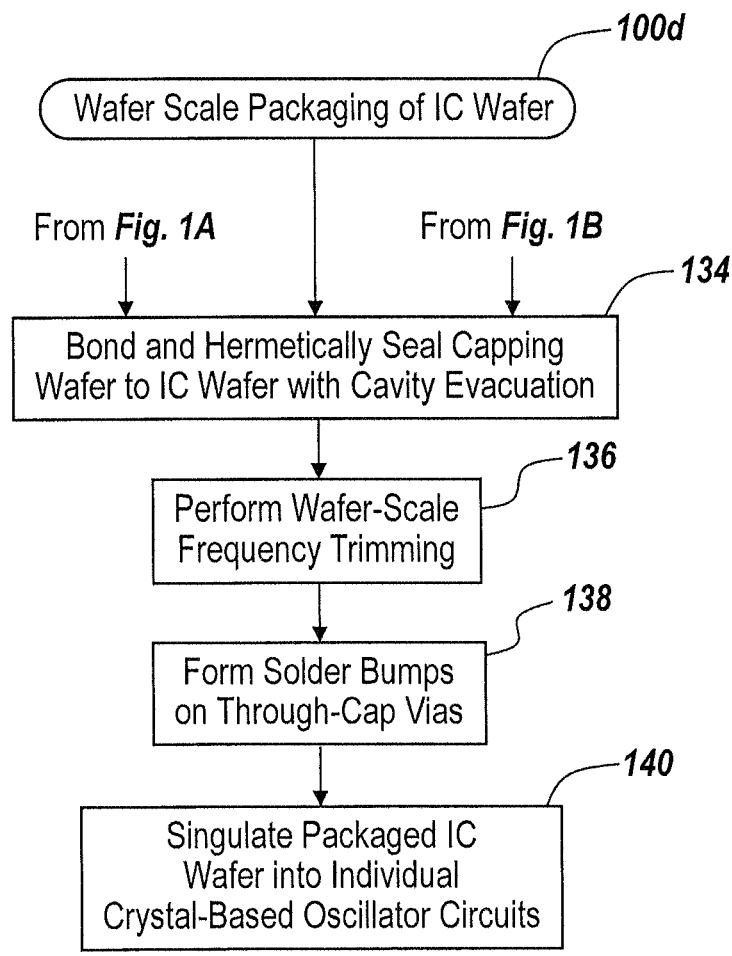

Referring now to FIGS. 1A-1C, methods of forming crystal-based oscillator circuits using wafer-scale fabrication techniques include: assembling resonator blanks at wafer scale 100a; preparing an integrated circuit (IC) wafer for crystal (XTAL) attachment 100b; preparing a capping wafer 100c; and performing wafer scale packaging of the IC wafer 100d. With respect to FIG. 1A, operations to assemble resonator blanks at wafer scale 100a may include cutting a bar of quartz into a plurality of wafers, Block 102, which are then polished and cut into discrete resonator blanks (e.g., rectangular resonator blanks), Block 104. The resonator blanks may be loaded into a quartz blank holder having a two-dimensional array of openings therein that span the active area of a semiconductor wafer. According to some embodiments of the invention, the quartz blank holder may include a nest, which is sandwiched between a pair of top and bottom shadow masks, Block 106. These shadow masks are utilized to define top and bottom electrodes on the resonator blanks. Thereafter, as shown by Block 108, top and bottom electrode metallization (with contact metallization) is deposited onto the resonator blanks within the shadow masks, Block 108. Although not shown, additional masks may also be used to enable the deposition of electrically conductive cement onto the contact metallization to thereby support attachment of the resonator blanks to an underlying integrated circuit wafer.

As shown by the right-side of FIG. 1A, operations to prepare an integrated circuit (IC) for crystal attachment 100b may include forming upper level metallization and external contact pads on a passivation layer, which covers an integrated circuit wafer having crystal-oscillator circuitry embedded therein, Block 110. According to some embodiments of the invention, the external contact pads may include a plurality of pads (e.g., six pads): a power supply contact pad (Vdd), a reference voltage contact pad (GND), a pair of differential periodic output signal pads OUT, OUT#, an input control voltage pad (Vcntl) and an output enable/disable pad (OE). Materials for hermetic sealing the IC wafer to a capping wafer may be selectively deposited onto the passivation layer, Block 112. The hermetic sealing material may be a eutectic alloy, which can also be deposited onto the external contact pads to enable electrical contact to corresponding through-substrate vias (within a capping wafer), as explained more fully hereinbelow. However, in alternative embodiments of the invention, a sealing material may be used that does not provide a fully hermetic seal. For example, the deposited sealing material may be suitable for glass frit bonding (a/k/a glass soldering, seal glass bonding), which utilizes a low melting temperature glass.

The step of forming the upper level metallization on the passivation layer, Block 110, may also include forming crystal oscillator terminals (in pairs) thereon. Thereafter, as illustrated by Block 114, electrode adhesion bumps (e.g., electrically conductive cement) may be deposited on the crystal oscillator terminals using, for example, screen or ink-jet printing. Other deposition techniques may also be used.

Referring still to FIG. 1A, the nested crystal resonator blanks may be mounted onto the integrated circuit wafer by contacting the electrode adhesion bumps to the top/bottom electrode contacts on the crystal resonator blanks, Block 116. As described above, the electrode adhesion bumps may be contacted directly to any electrically conductive cement on the top/bottom electrode contacts. This use of electrically conductive cement on the top/bottom electrode contacts of the resonator blanks may be particularly advantageous for overtone-mode resonator blanks (e.g., $3^{rd}$, $5^{th}$ overtone blanks) having sharp edges. As shown by Blocks 118, 120, the integrated circuit wafer (with resonator blanks mounted thereon) is removed from the shadow mask and the electrode adhesion bumps (e.g., conductive cement) are cured. In some embodiments of the invention, the curing of the adhesion bumps may be performed as a two-step cure process performed in a vacuum. In these embodiments, the first step is performed at a sufficiently high temperature to drive off volatiles in the cement and then the second step is performed at a higher temperature to increase the strength of the cement in supporting the resonator blanks. In still further embodiments of the invention, the contacting of the electrode adhesion bumps to the top/bottom electrode contacts, Block 116, may be performed using a pre-heated conductive cement.

As shown by FIG. 1B, operations to prepare a capping wafer 100c can include patterning and selectively etching deep recesses into a capping wafer, Block 122, using, for example, deep reactive ion etching (DRIE). These recesses may be rectangular in shape and of sufficient size to fully enclose subsequently received crystal resonator blanks, which are aligned 1:1 thereto when bonded to the integrated circuit wafer. As shown by Blocks 124-126, an array of through-cap openings, which may be formed to extend through the capping wafer, may be filled with through-cap electrically conductive vias/plugs. As described more fully hereinbelow, six openings may be formed around of each of the recesses in the capping wafer and filled to thereby enable electrical contact to the power supply contact pad (Vdd), the reference voltage contact pad (GND), the pair of differential periodic output signal pads OUT, OUT#, the input control voltage pad (Vcntl) and the output enable/disable pad (OE). Alternatively, four pads may be provided for signals OUT, OE, Vdd and GND, when only a single-sided output signal is required. As will be understood by those skilled in the art, the steps illustrated by Blocks 124-126 may actually be performed after the capping wafer and integrated circuit wafer have been bonded together.

Materials for hermetic sealing (e.g., eutectic metal) or non-hermetic sealing may be selectively deposited onto the capping wafer to support bonding operations, as explained hereinbelow, Block 128. If necessary, passive resonator elements (e.g., inductor elements) may be formed within the recesses in the capping wafer, Block 130, in addition to any material (e.g., electrically insulating material) used for frequency trimming (e.g., mass loading), Block 132.

Referring now to FIG. 1C, operations to perform wafer scale packaging of the integrated circuit wafer 100d may include bonding and sealing (e.g., hermetic or non-hermetic) the capping wafer to the integrated circuit wafer concurrently with performing vacuum evacuation of the cavities within the recesses in the capping wafer, Block 134. Thereafter, as shown by Block 136, wafer-scale frequency trimming operations may be performed on a device-by-device basis by removing electrode material from one or more of the quartz resonator blanks within the sealed recesses within the capping wafer or depositing material (e.g., insulating material or thinly deposited metal (e.g., Au)) onto the resonator blanks to support frequency adjustment through mass loading. Finally, as shown by Blocks 138 and 140, solder bumps (optional) may be formed on the electrically conductive through-cap vias in the capping wafer before the packaged crystal-based oscillator circuits are singulated into individual circuits by dicing the capping wafer (and underlying integrated circuit wafer) along a two-dimensional grid of dicing streets extending between the hermetically-sealed recesses within the capping wafer.

Figure 2A:
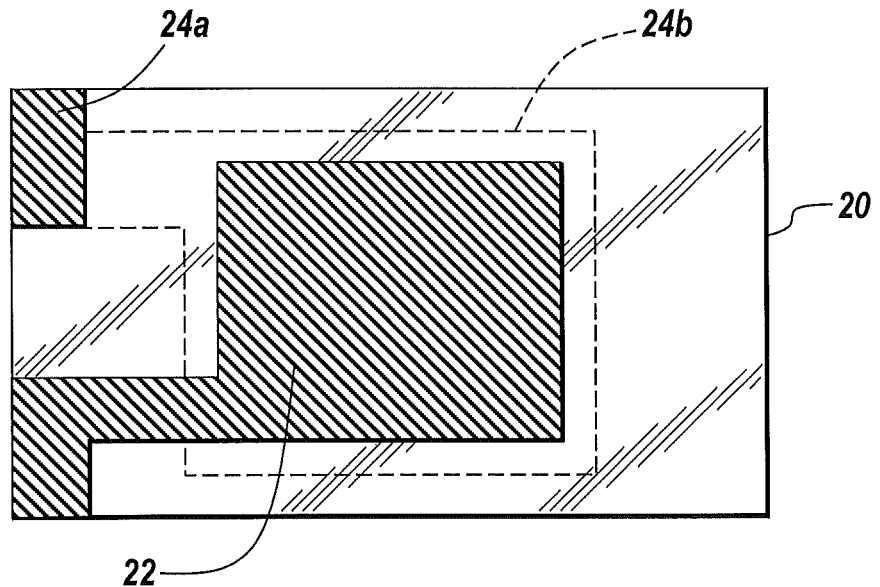
FIGS. 2A-2C are plan views of rectangular-shaped quartz resonator blanks having top and bottom electrodes formed thereon with top-side electrode contacts.
Figure 2B:
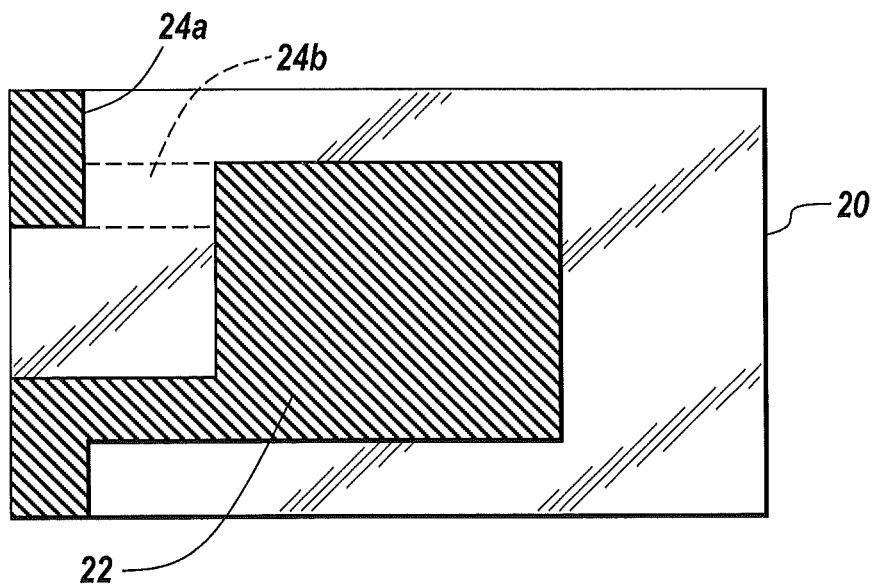
Figure 2C:
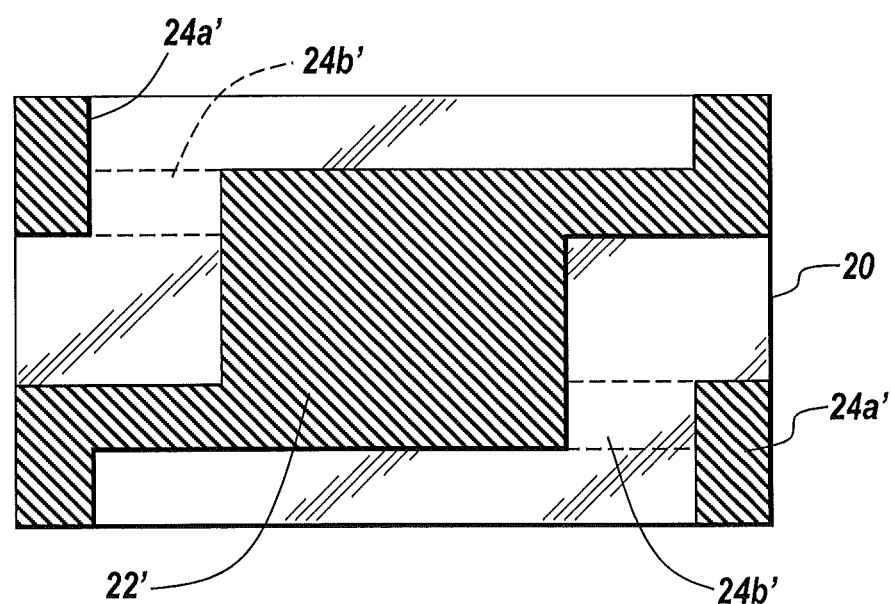

As described above with respect to Blocks 106-108 and 116, the resonator blanks with top/bottom electrode metallization may be configured as illustrated by FIGS. 2A-2C. In particular, as shown by FIG. 2A, a quartz resonator blank 20 may include a top electrode and contact 22 thereon, which is smaller in length and width dimensions relative to a bottom electrode 24b (with top-side bottom electrode contact 24a). In contrast, FIG. 2B illustrates a quartz resonator blank 20 having a top electrode and contact 22 thereon, which is equivalent in dimensions relative to a bottom electrode 24b (with top-side bottom electrode contact 24a). FIG. 2C illustrates a quartz resonator blank 20 having a top electrode 22' with diagonally opposite contacts and a bottom electrode 24b' with diagonally opposite top-side contacts 24a', which enable multiple orientations (e.g., 180° rotations) of the blank 20 within a quartz holder prior to mounting to an integrated circuit wafer.

Figure 3A:
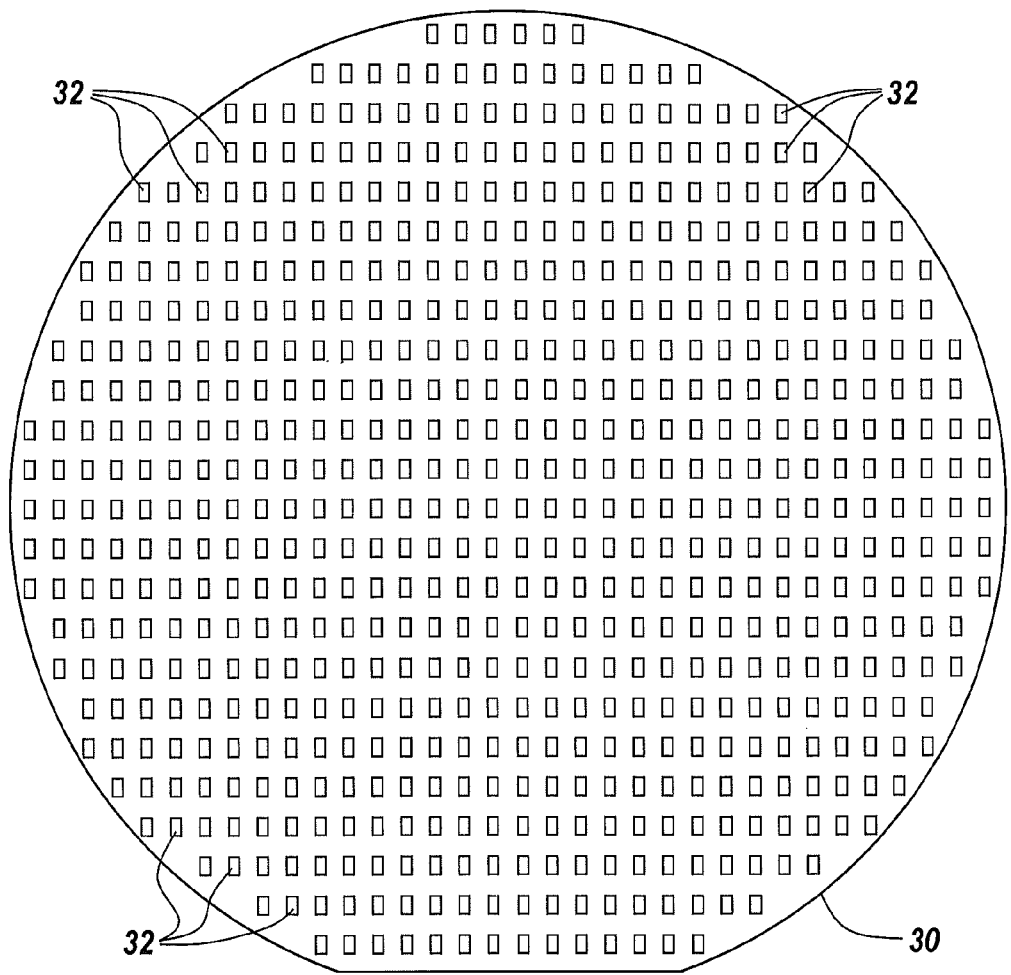
FIG. 3A is a plan view of a wafer-scale quartz blank holder, according to an embodiment of the present invention.
Figure 3B:
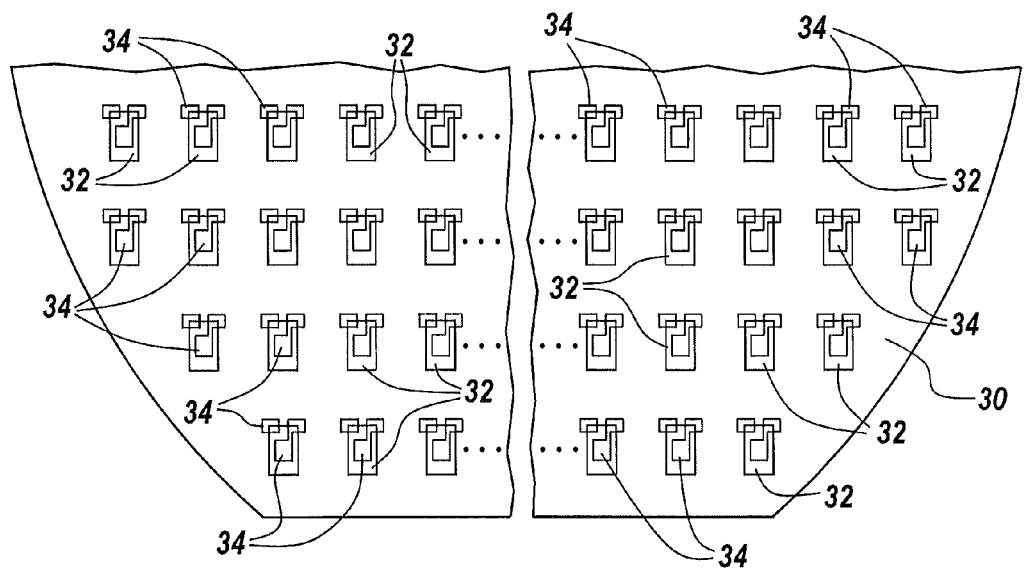
FIG. 3B is a top-down view of a bottom electrode shadow mask mounted underneath the quartz blank holder of FIG. 3A.
Figure 3C:
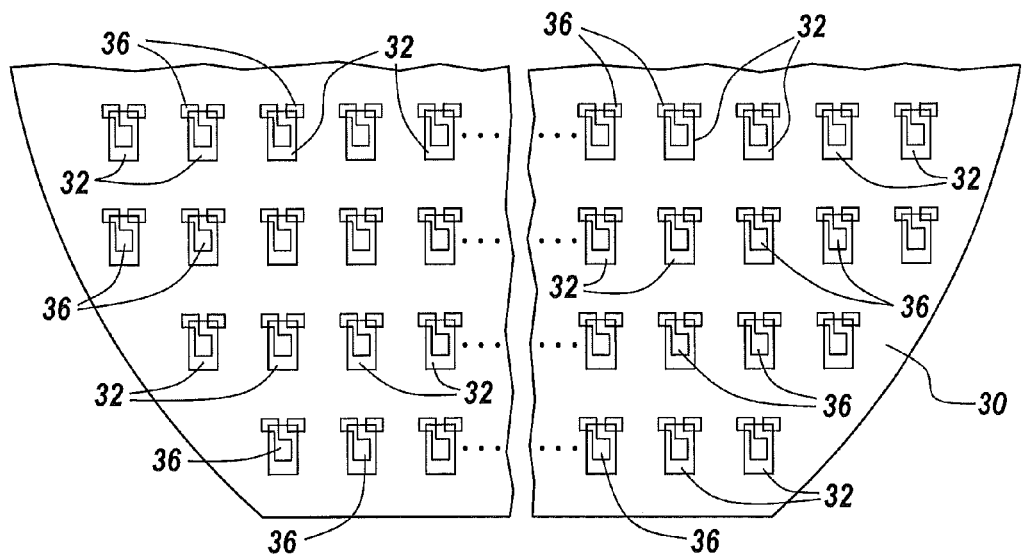
FIG. 3C is a top-down view of a top electrode shadow mask mounted to the quartz blank holder of FIG. 3A.
Figure 3D:
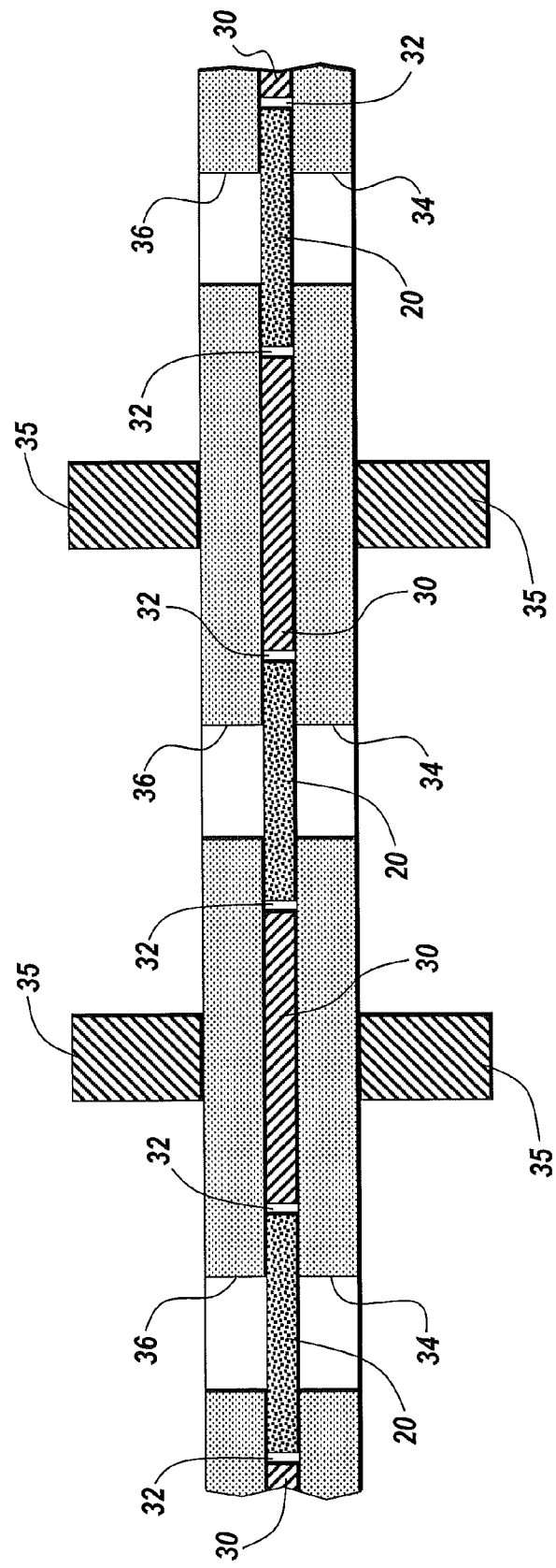
FIG. 3D is a cross-sectional view of a portion of the double-sided shadow mask having a quartz blank holder nested therein.

FIG. 3A illustrates a wafer-scale quartz blank holder 30 having a two-dimensional array of rectangular-shaped openings 32 therein, which have sufficient size to retain quartz crystal blanks therein, as illustrated by FIG. 3D. FIG. 3B is a bottom-up view of a bottom electrode shadow mask mounted to the quartz blank holder of FIG. 3A. This bottom electrode shadow mask includes patterned openings 34 therein that are aligned to each opening 32 within the blank holder 30 and support formation of bottom electrodes on quartz blanks held within the openings 32. In particular, the patterned openings 34 are sufficiently large that they extend outside the dimensions of the openings 32 in the blank holder 30. Accordingly, during bottom electrode deposition, which may be performed at an offset angle relative to normal, the metallization applied to the bottom of the quartz blanks 20 will wrap around the beveled/curved edges of the blanks 20 and support full bottom-to-top wrap-around of the electrically conductive contact cement. FIG. 3C is a top-down view of a top electrode shadow mask mounted to the quartz blank holder of FIG. 3A. This top electrode shadow mask includes patterned openings 36 therein that are aligned to each opening 32 within the blank holder 30 and support formation of top electrodes (and top/bottom electrode contacts) on quartz blanks held within the openings 32. In particular, the patterned openings 36 are sufficiently large that they extend outside the dimensions of the openings 32 in the blank holder 30. Accordingly, during top electrode deposition, which may be performed at an offset angle relative to normal, the metallization applied to the top of the quartz blanks 20 will wrap around the beveled/curved edges of the blanks 20. FIG. 3D illustrates a cross-sectional view of a portion of the double-sided shadow mask of FIGS. 3A-3C having a quartz blank holder 30 nested therein. According to some embodiments of the invention, the quartz blank holder 30 may be permanently mounted to one of the top and bottom shadow masks, but the top and bottom shadow masks may be held in a fixed position relation relative to each other using an array of magnets 35, which operate to hold at least one shadow masks against the quartz blank holder 30 when populated with quartz blanks 20.

Figure 4A:
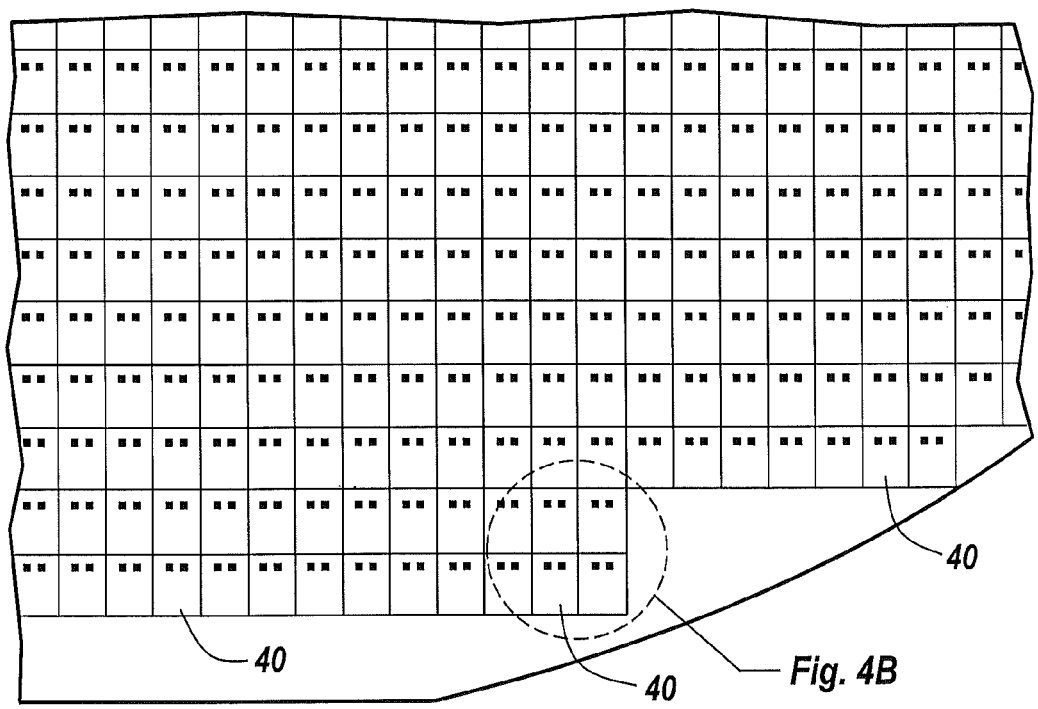
FIG. 4A is a plan view of a portion of an integrated circuit wafer having a two-dimensional array of oscillator circuits therein, which include respective pairs of electrode adhesion bumps on a surface thereof.
Figure 4B:
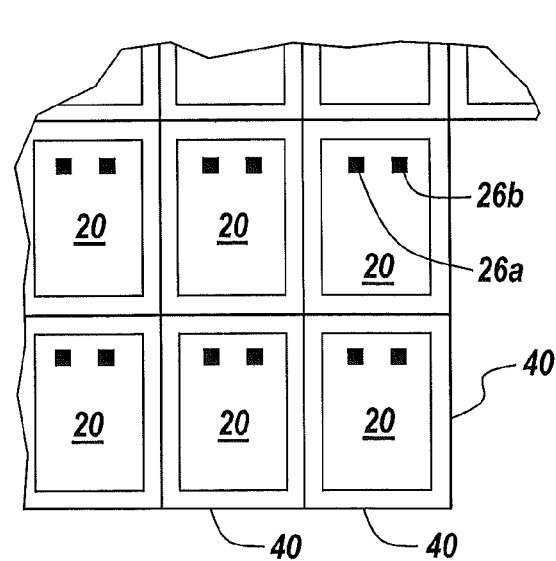
FIG. 4B is an enlarged view of a portion of the integrated circuit wafer of FIG. 4A, after crystal resonator blanks have been mounted thereon.
Figure 4C:
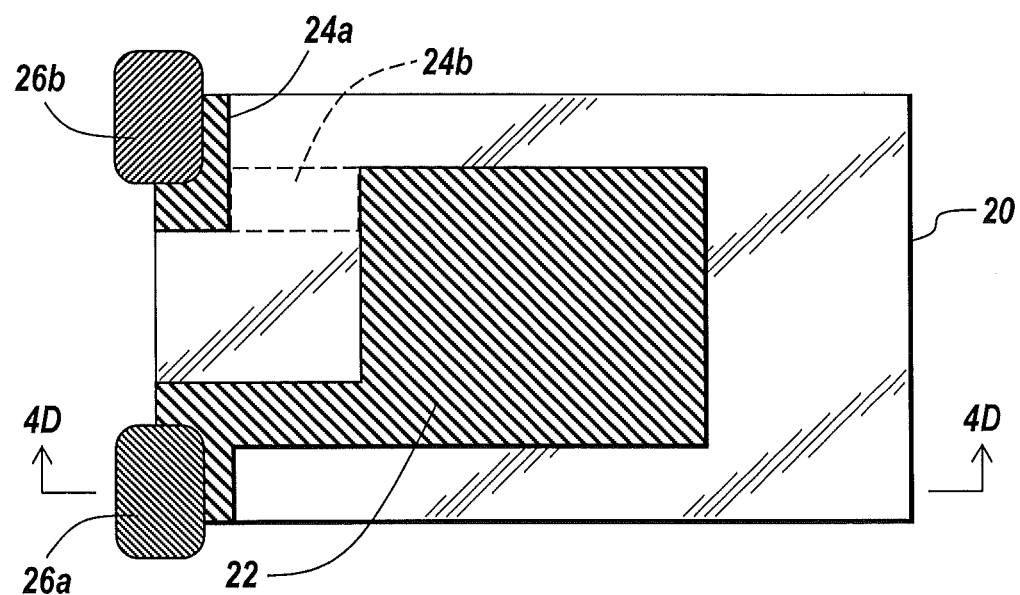
FIG. 4C is a plan view of crystal resonator blank of FIG. 4B.
Figure 4D:
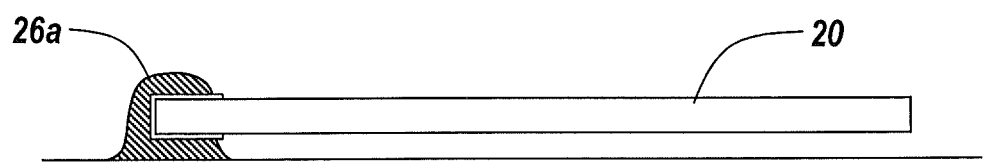
FIG. 4D is a cross-sectional view of the crystal resonator blank of FIG. 4C, taken along line 4D-4D'.

Referring now to FIGS. 4A-4B, an integrated circuit wafer having a two-dimensional array of oscillator circuits 40 therein is illustrated as including respective pairs of electrode adhesion bumps 26a, 26b (e.g., electrically conductive cement) on a surface thereof. These adhesion bumps 26a, 26b may be formed as described hereinabove with respect to Block 114 in FIG. 1A. FIG. 4B is an enlarged view of a portion the integrated circuit wafer of FIG. 4A, after crystal resonator blanks 20 have been mounted thereon as disclosed above with respect to Blocks 116-120 in FIG. 1A. In particular, as shown by FIGS. 4C-4D, the electrode adhesion bumps 26a, 26b may be configured to provide electrical contact to the top and bottom electrodes (22, 24a-24b) associated with each resonator blank 20 and support each resonator blank 20 at a fixed distance above a surface of an underlying oscillator circuit 40 (e.g., above a surface of a passivation layer overlying an oscillator circuit embedded within a silicon substrate).

Figure 5A:
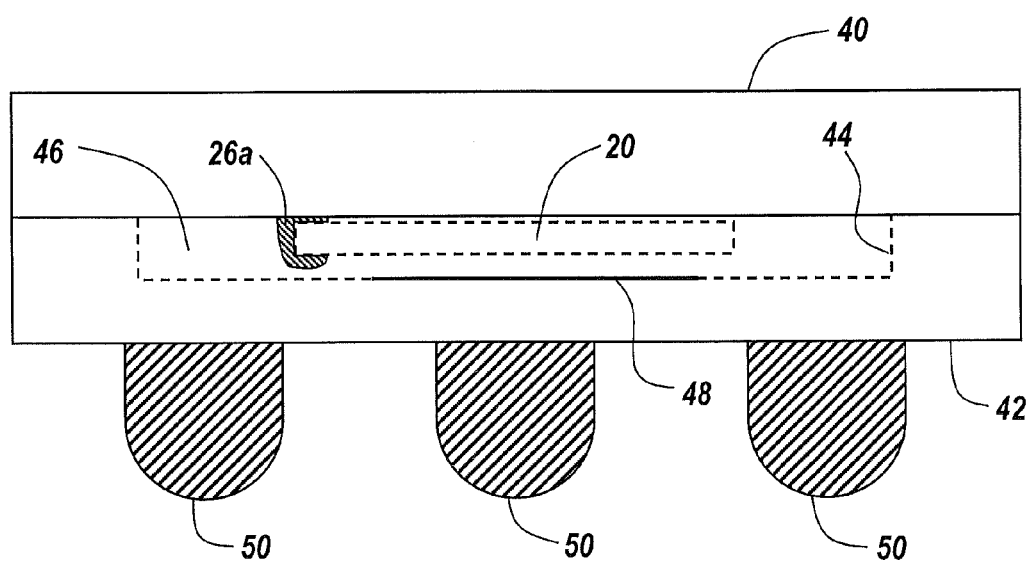
FIG. 5A is a cross-sectional view of packaged crystal-based oscillator circuit, according to embodiments of the invention.
Figure 5B:
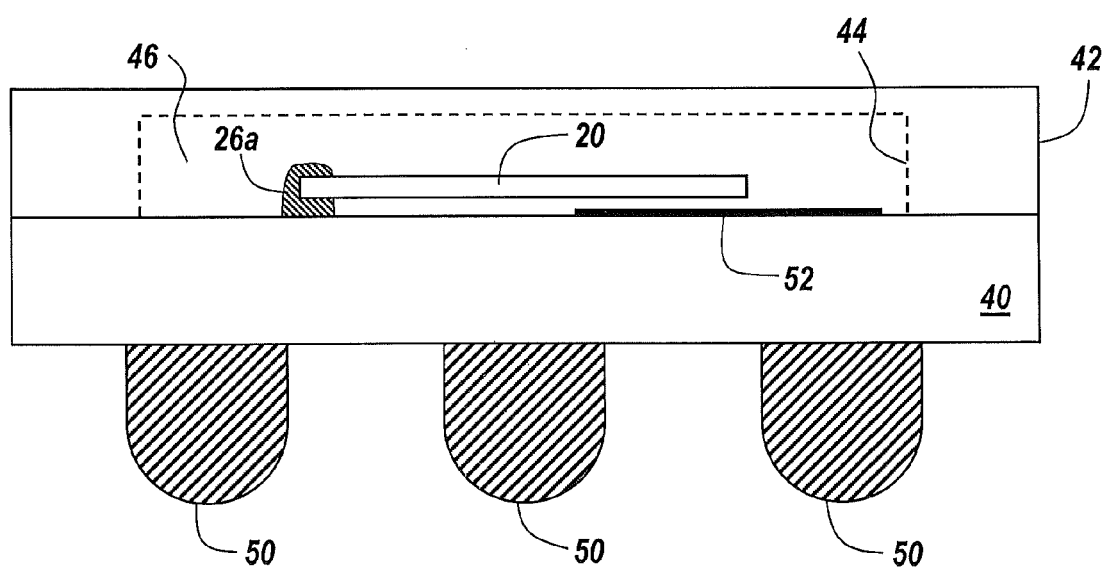
FIG. 5B is a cross-sectional view of packaged crystal-based oscillator circuit with built-in inductor, according to embodiments of the invention.

FIGS. 5A-5B illustrate packaged crystal-based oscillator circuits, which may be finalized as described hereinabove with respect to FIG. 1C and possibly using one or more steps described in U.S. Pat. No. 7,955,885 to Bhugra et al., the disclosure of which is hereby incorporated herein by reference. As illustrated, the packaged oscillator circuit includes an integrated circuit substrate 40 (e.g., silicon die), which has oscillator circuitry therein, and a cap 42 (e.g., silicon cap), which is hermetically bonded to the substrate 40 (e.g., using a eutectic alloy). As described above, each singulated cap 42 includes a recess 44 and cavity 46 therein, which houses a resonator blank 20. This resonator blank 20 is mounted and electrically connected to the underlying substrate 40 by the electrically conductive adhesion bumps 26a, 26b. Electrically conductive through-cap vias (not shown) electrically connect solder bumps 50 to corresponding pads on the substrate 40 in the embodiment of FIG. 5A. In FIG. 5B, the solder bumps 50 are directly connected to the substrate 40.

As further shown by FIG. 5A, the recess 44 within the cap 42 may also include a deposited material layer 48, which can be partially transferred to the resonator blank 20 (as mass loading) during an electrical trimming operation. This electrical trimming operation may be performed before and/or after the singulation of the packaged integrated circuit wafer. According to additional embodiments of the invention, the material layer 48 may be an electrically conductive layer that is formed by removing electrode material from the resonator blank 20 during electrical trimming. In contrast, FIG. 5B illustrates the presence of an inductor 52 on a surface of the substrate 40. As shown, at least a portion of this inductor 52 (e.g., spiral inductor) may be disposed between the resonator blank 20 and the substrate 40. In particular, the inductor 52 may be disposed on an upper passivation layer, which covers the substrate 40. According to some embodiments of the invention, this passivation layer may contain a magnetically reflective layer (e.g., M1 metal layer) that inhibits a reduction in inductor Q caused by the underlying "lossy" substrate.

Figure 6A:
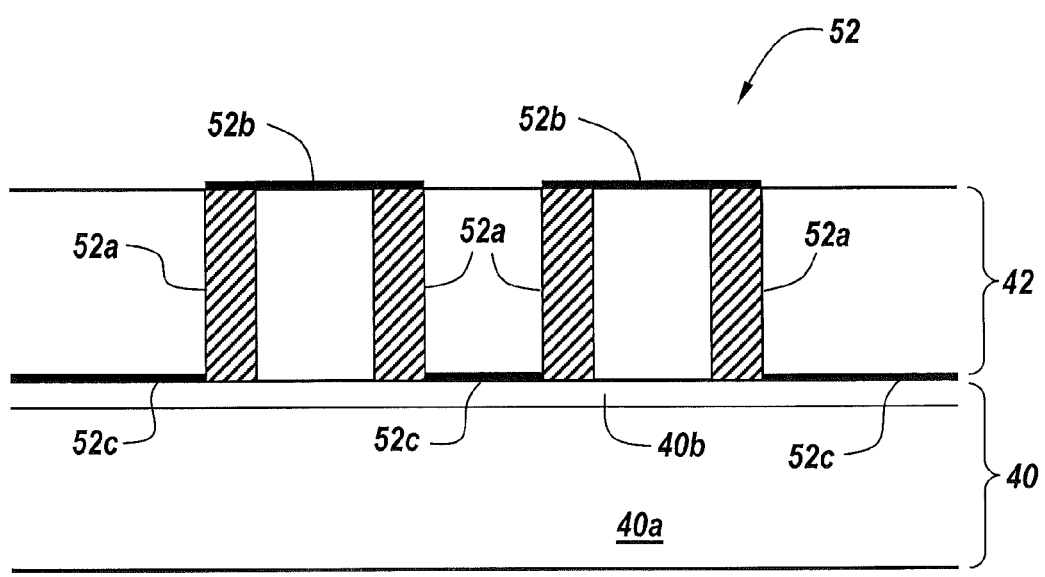
FIG. 6A illustrates a cross-section of an inductor formed in a cap of a packaged oscillator circuit, according to an embodiment of the present invention.

Referring now to FIG. 6A, an inductor 52 may be configured with vertical through-cap vias 52a (TCVs) and planar segments 52b, 52c that are serially connected together, with segments 52b extending on an outside top surface of a cap 42 of a packaged oscillator circuit and segments 52c extending between a bottom surface of the cap 42 and underlying IC passivation layers 40b, which extend on an uppermost surface (e.g., active circuit surface) of an underlying integrated circuit chip 40a within an integrated circuit substrate 40. A centermost bottom segment 52c may be utilized as a center-tap (CT) of the inductor 52 in some embodiments of the invention.

Figure 6B:
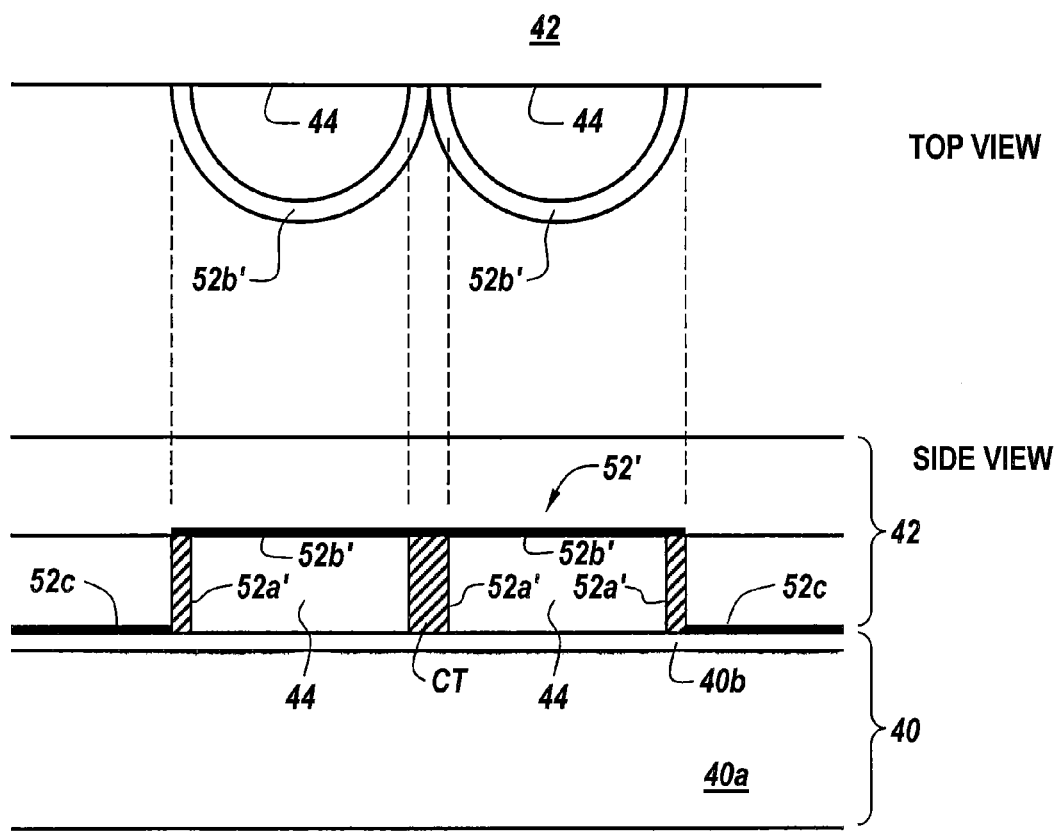
FIG. 6B illustrates a cross-section of an inductor patterned along a sidewall and top surface of a cavity within a packaged oscillator circuit, according to an embodiment of the present invention.

In contrast, the inductor 52' of FIG. 6B replaces the TCVs 52a of FIG. 6A with inductor segments 52a', 52b', which are patterned on a sidewall and top inner surface of a recess 44 within the cap 42, respectively. As shown, the segments 52b' are arcuate-shaped (e.g., circular) inductor segments that are joined at a center tap (CT) of the inductor 52' and the outermost sidewall segments 52a' are electrically connected to lateral segments 52c, which extend between a bottom surface of the cap 42 and the underlying IC passivation layers 40b.

Figure 7:
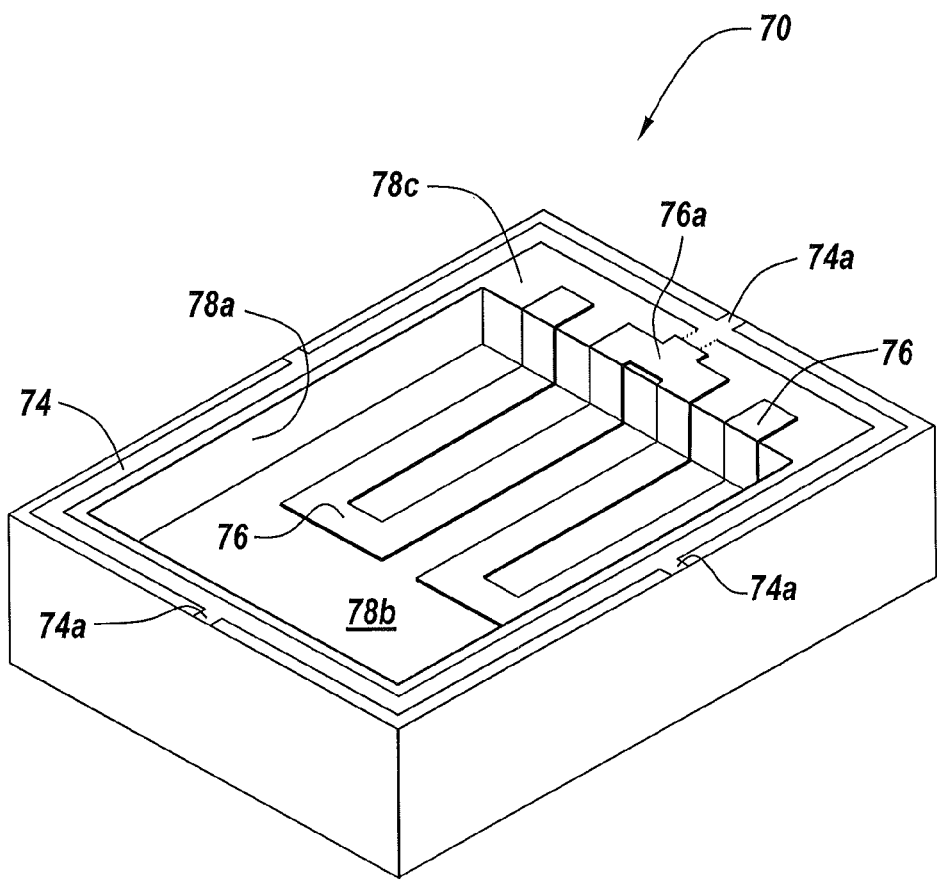
FIG. 7 is a three-dimensional perspective view of an electrically insulating cap having a recess therein containing a patterned inductor, according to an embodiment of the invention.

Referring now to FIG. 7, a three-dimensional perspective view of an electrically insulating cap 70 (e.g., glass cap) is illustrated as including a recess therein having a plurality of sidewalls 78a, an interior top surface 78b within the recess and a primary/bonding surface 78c containing a metal seal ring 74 with tie bar extensions 74a on each side thereof. As shown, a center-tap inductor 76 is patterned to extend on each of the interior top surface 78b, sidewall 78a and bonding surface 78c. In some embodiments of the invention, the inductor 76 may include a pair of arcuate-shaped segments, which may be mirror-images of each other about a center tap. Preferably, these arcuate-shaped segments have rounded corners and may even be semicircular-shaped. In additional embodiments of the invention, a center tap 76a of the inductor 76 may be provided, which is electrically connected to the metal seal ring 74. This metal seal ring 74 may be held at a fixed potential (e.g., GND) during operation of a packaged integrated circuit. According to additional embodiments of the invention, the cap 70 may include a magnetic material therein, which increases an effective inductance of the inductor 76 relative to an otherwise equivalent cap and inductor combination that is devoid of the magnetic material, such as a ferrous-type material or a magnetic rare-earth material.

According to still further embodiments of the invention, methods of forming the electrically insulating cap 70 of FIG. 7 may utilize wafer-scale fabrication techniques, which can include providing a glass plate having a two-dimensional array of recesses (78a, 78b) therein and then plating a relatively thin electrically conductive material (e.g., copper (Cu)) and possibly an adhesion layer using an electroless plating bath, for example. Alternatively, this plating step, if used, may be selective to the non-recess side of the glass plate/wafer. The shape of the center-tap inductor 76 within each of the recesses may be defined by performing deep resolution photoresist and patterning steps on the electrically conductive material. To achieve a desired inductor performance, an electroplating step may be performed to selectively thicken the inductor pattern, using tie bars and seal rings (74, 74a) to provide a necessary electrical connection between all recesses on the plate. In some embodiments of the invention, this electroplating step may utilize a combination of copper (Cu) followed by a low temperature eutectic solder (e.g., AuSn) to enable sealing of the seal rings 74 to a similarly patterned connection material in an underlying integrated circuit wafer, prior to dicing.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:
1. A packaged integrated circuit, comprising:
an integrated circuit substrate; and
a packaging cap bonded to an upper surface of said integrated circuit substrate, said packaging cap having a recess therein that at least partially defines an interior of a sealed cavity extending between said packaging cap and the upper surface of said integrated circuit substrate and is at least partially lined with at least one segment of an inductor, which is exposed to the sealed cavity;

wherein said packaging cap comprises a magnetic material therein that increases an effective inductance of the inductor relative to an otherwise equivalent packaging cap and inductor combination that is devoid of the magnetic material;

wherein the inductor and the magnetic material are electrically disconnected from each other; and wherein the sealed cavity extends between the magnetic material and the upper surface of said integrated circuit substrate.

2. The packaged integrated circuit of claim 1, wherein the inductor is electrically coupled to an electrical component within a semiconductor chip region within said integrated circuit substrate; wherein the electrical component is separated from the upper surface of said integrated circuit substrate by at least one electrically insulating passivation layer; and wherein the inductor is electrically coupled to the electrical component by a metal contact pad on the upper surface of said integrated circuit substrate.

3. The packaged integrated circuit of claim 1, wherein the inductor is patterned to extend along a sidewall of the recess and on an interior top surface of the recess, which extends opposite said integrated circuit substrate.

4. The packaged integrated circuit of claim 3, wherein the inductor includes a plurality of arcuate-shaped segments that extend on the interior top surface of the recess; and wherein each of the arcuate-shaped segments is exposed to the sealed cavity.

5. The packaged integrated circuit of claim 3, wherein the inductor is a center-tapped inductor; wherein the inductor is patterned to be symmetric about a center-tapped portion thereof; and wherein the inductor has at least one terminal located external to the recess.

6. The packaged integrated circuit of claim 1, wherein said packaging cap is hermetically sealed to said integrated circuit substrate; and wherein the sealed cavity is a hermetically sealed cavity.

7. The packaged integrated circuit of claim 6, wherein said packaging cap is hermetically sealed to said integrated circuit substrate using a metal seal ring on said packaging cap, which is bonded to the upper surface of said integrated circuit substrate.

8. The packaged integrated circuit of claim 1, wherein said packaging cap comprises a diced portion of a glass plate.

9. The packaged integrated circuit of claim 8, wherein the diced portion of the glass plate includes the magnetic material therein, said magnetic material extending between an outer surface of the diced portion of the glass plate and the sealed cavity and comprising a material selected from a group consisting of a ferrous-type material and a magnetic rare-earth material.

10. The packaged integrated circuit of claim 7, wherein the hermetically sealed cavity is a vacuum evacuated cavity.

11. The packaged integrated circuit of claim 7, wherein the metal seal ring is electrically connected to the at least one inductor segment.

12. A packaged integrated circuit, comprising:

an integrated circuit substrate; and a packaging cap bonded to an uppermost surface of said integrated circuit substrate, said packaging cap having a recess therein that: (i) at least partially defines an interior of a sealed cavity extending between said packaging cap and the uppermost surface of said integrated circuit substrate; and (ii) is lined with a plurality of arcuate-shaped segments of an inductor that are exposed to the sealed cavity;

wherein said packaging cap comprises a magnetic material therein that increases an effective inductance of the inductor relative to an otherwise equivalent packaging cap and inductor combination that is devoid of the magnetic material;

wherein the inductor and the magnetic material are electrically disconnected from each other; and and wherein the sealed cavity extends between the magnetic material and said integrated circuit substrate.

13. The packaged integrated circuit of claim 12, wherein the inductor is electrically coupled to an electrical component within a semiconductor region within said integrated circuit substrate; wherein the electrical component is separated from the uppermost surface of said integrated circuit substrate by at least one electrically insulating passivation layer; and wherein the inductor is electrically coupled to the electrical component by a metal contact pad extending adjacent the uppermost surface of said integrated circuit substrate.

14. The packaged integrated circuit of claim 12, further comprising a magnetically reflective metal plane covering at least a portion of said packaging cap; and wherein the sealed cavity extends between the magnetically reflective metal plane and the uppermost surface of said integrated circuit substrate.

15. The packaged integrated circuit of claim 12, wherein the inductor is patterned to be symmetric about a center-tapped portion thereof.

* * * * *